United States Patent
Wan et al.

(10) Patent No.: US 10,521,546 B2
(45) Date of Patent: Dec. 31, 2019

(54) OPTICAL PROXIMITY CORRECTION METHOD AND SYSTEM

(71) Applicant: CSMC TECHNOLOGIES FAB2 CO., LTD., Wuxi New District (CN)

(72) Inventors: Jinyin Wan, Wuxi New District (CN); Jinheng Wang, Wuxi New District (CN); Lei Zhang, Wuxi New District (CN); Jie Chen, Wuxi New District (CN)

(73) Assignee: CSMC TECHNOLOGIES FAB2 CO., LTD., Wuzi New District (CN)

( * ) Notice: Subject to any disclaimer, the term of this patent is extended or adjusted under 35 U.S.C. 154(b) by 91 days.

(21) Appl. No.: 15/756,799

(22) PCT Filed: May 11, 2016

(86) PCT No.: PCT/CN2016/081701
§ 371 (c)(1),
(2) Date: Mar. 1, 2018

(87) PCT Pub. No.: WO2017/036173
PCT Pub. Date: Mar. 9, 2017

(65) Prior Publication Data
US 2018/0252996 A1    Sep. 6, 2018

(30) Foreign Application Priority Data

Sep. 2, 2015   (CN) .......................... 2015 1 0558089

(51) Int. Cl.
*G06F 17/50* (2006.01)
*G03F 1/00* (2012.01)
(Continued)

(52) U.S. Cl.
CPC ............ *G06F 17/5081* (2013.01); *G03F 1/36* (2013.01); *G03F 7/70441* (2013.01); *G06F 17/5068* (2013.01)

(58) Field of Classification Search
None
See application file for complete search history.

(56) References Cited

U.S. PATENT DOCUMENTS 7,324,930 B2 * 1/2008 Cobb ........................ G03F 1/36
430/5
7,434,199 B2 * 10/2008 Cobb ........................ G03F 1/36
716/51

(Continued)

FOREIGN PATENT DOCUMENTS

CN    101359343 A    2/2009
CN    101995763 A    3/2011
(Continued)

OTHER PUBLICATIONS

P.J. LaCour et al., "Prediction of design sensitivity to altPSM lithography across process window," Proc. of SPIE 5567, 24th Annual BACUS Symposium on Photomask Technology, 2004, pp. 604-613. (Year: 2004).*

(Continued)

*Primary Examiner* — Leigh M Garbowski
(74) *Attorney, Agent, or Firm* — Kagan Binder, PLLC

(57) ABSTRACT

An optical proximity correction method, comprising: dissecting an edge of a design pattern (120/220) to form a segment (Seg1/Seg2); setting target points of the segments (Seg1/Seg2), and if the segments (Seg1/Seg2) translate in a direction vertical to the segments (Seg1/Seg2), controlling tangent points (P1/P2) of the segments (Seg1/Seg2) tangent to a simulated pattern (110/210) to coincide with the target points; computing edge position differences of the target (Continued)

points; and correcting the design pattern (120/220) according to the edge position differences.

8 Claims, 3 Drawing Sheets

(51) Int. Cl.
    *G03F 7/00* (2006.01)
    *G03F 7/20* (2006.01)
    *G03F 1/36* (2012.01)

(56) References Cited

U.S. PATENT DOCUMENTS

| | | | |
|---|---|---|---|
| 7,568,174 B2* | 7/2009 | Sezginer | G03F 1/36 716/112 |
| 7,600,212 B2* | 10/2009 | Zach | G03F 1/36 716/50 |
| 8,230,372 B2* | 7/2012 | Agarwal | G03F 1/36 716/50 |
| 8,331,646 B2* | 12/2012 | Agarwal | G03F 1/36 382/144 |
| 9,165,214 B2* | 10/2015 | Abe | G01B 15/04 |
| 9,620,615 B2 | 4/2017 | Deng et al. | |
| 9,646,220 B2* | 5/2017 | Weisbuch | G06T 5/50 |
| 9,673,193 B2 | 6/2017 | Zhang et al. | |
| 9,862,595 B2 | 1/2018 | Jing | |
| 9,947,785 B2 | 4/2018 | Han et al. | |
| 9,952,609 B2 | 4/2018 | Zhang et al. | |
| 9,953,970 B2 | 4/2018 | Zhang et al. | |
| 9,954,074 B2 | 4/2018 | Zhong et al. | |
| 9,975,766 B2 | 5/2018 | Hu et al. | |
| 9,977,342 B2 | 5/2018 | Yao | |
| 10,014,392 B2 | 7/2018 | Qi et al. | |
| 10,101,225 B2 | 10/2018 | Qian | |
| 10,317,203 B2* | 6/2019 | Minakawa | G01B 21/20 |
| 2007/0074143 A1 | 3/2007 | Bailey Cobb et al. | |
| 2007/0079278 A1 | 4/2007 | Tanaka et al. | |
| 2009/0281778 A1* | 11/2009 | Belledent | G03F 1/36 703/6 |
| 2016/0233216 A1 | 8/2016 | Zhang et al. | |
| 2017/0011144 A1 | 1/2017 | Hu et al. | |
| 2017/0011957 A1 | 1/2017 | Wang et al. | |
| 2017/0205470 A1 | 7/2017 | Li et al. | |
| 2018/0130877 A1 | 5/2018 | Huang et al. | |
| 2018/0139544 A1 | 5/2018 | Hu | |
| 2018/0342609 A1 | 11/2018 | Qi et al. | |
| 2018/0358390 A1 | 12/2018 | Liu et al. | |

FOREIGN PATENT DOCUMENTS

| | | |
|---|---|---|
| CN | 103149792 A | 6/2013 |
| CN | 101995763 A | 7/2013 |
| CN | 103186032 A | 7/2013 |
| CN | 103186034 A | 7/2013 |
| JP | 2008134382 A | 6/2008 |
| KR | 20150024500 A | 3/2015 |
| WO | 2010085714 A2 | 7/2010 |

OTHER PUBLICATIONS

C.H. Wang et al. "Accelerate OPC convergence with new iteration control methodology," Proc of SPIE 7122, Photomask Technology 2008, 8 pages. (Year: 2008).*
L. Zhu et al., "Study of the contour-based optical proximity correction methodology," J. Micro/Nanolith, MEMS MOEMS, vol. 8, No. 4, 2009 SPIE, 7 pages. (Year: 2009).*
S. Kim et al., "Model-based HSF using by target point control function," Proc of SPIE 9426, Optical Microlithography XXVIII, 2015, 8 pages. (Year: 2015).*
Unpublished U.S. Appl. No. 15/770,624, filed Apr. 24, 2018 (14 pages).
Unpublished U.S. Appl. No. 16/305,119, filed Nov. 28, 2018 (31 pages).
International Search Report and English Translation thereof for International Application No. PCT/CN2016/081701, dated Aug. 8, 2016 (6 pages).
Chinese Office Action for Chinese Application No. 201510558089.8, dated Apr. 3, 2019, (6 pages).

* cited by examiner

OPTICAL PROXIMITY CORRECTION METHOD AND SYSTEM

TECHNICAL FIELD

The present disclosure is related to the technical field of semiconductor manufacture, and in particular relates to a method and system of optical proximity correction (OPC).

BACKGROUND

In the semiconductor manufacturing process, as the photolithographic size is increasingly smaller, the resolution enhancement technique (RET) is widely adopted. In a case under the technology node of 180 nm, the OPC technology in RET is adopted as a conventional technical means. In the process of correction, two methods are usually adopted, one is the rule based OPC, another is the model based OPC (MBOPC); when the MBOPC manner is selected, the design pattern will be dissected into several relatively short segments, and target points of corresponding segments can be set. By way of introducing an edge placement error (EPE), i.e., the difference between the simulated value and the target value at the target point, so as to evaluate the result of each correction loop of the OPC. In the event the statistic values of the EPE of all segments reached a certain range, it is considered that the placement of all segments are completed; the placement process usually requires 3-8 rounds of repeated calculation, so as to ensure the statistic values of the EPE of all segments will reach a certain range.

In a conventional method of OPC, the placement location of the target points of the segments is relatively unchanged typically, such as setting to be the center or the end of each segment. Such a unchanged placement results in an insufficient adaptability to different patterns, whereby insufficient-correction or over-correction problems are caused, such that the correction is of low precision.

SUMMARY

Accordingly, it is necessary to provide a method of OPC that can effectively improve the correction precision. Also, a system of OPC is provided.

A method of OPC includes:

dissecting an edge of a design pattern to form a segment;

setting a target point at the segment, if the segment is translated in a direction perpendicular to the segment, a tangent point of the segment and a simulated pattern coincides with the target point;

calculating an EPE of the target point; and correcting the design pattern according to the EPE.

A system of OPC includes:

a dissection module configured to dissect an edge of a design pattern to form a plurality of segments;

a setting module configured to set a target point at the segment, if the segment is translated in the direction perpendicular to the segment, a tangent point of the segment and a simulated pattern coincides with the target point;

a calculation module configured to calculate an EPE of the target point; and a correction module configured to correct the design pattern according to the EPE.

According to the foregoing method and system of OPC, the setting method of the target point of the segment is no longer unchanged, but varies with the pattern, usually, one end of the curve of the simulated pattern corresponding to the segment is selected as the reference position of the target point. The end of the curve can be determined by the following method: if the segment is translated in the direction perpendicular to the segment, the tangent point of the segment with the simulated pattern is the end of the curve, then the end of the curve coincides with the target point. As for this segment, usually the EPE at the position corresponding to the end of the curve is maximal, the pattern is corrected again according to the EPE, so as to effectively decrease the times of correction, reduce the extent of insufficient correction or over correction, provide the simulated result to be more matched with the target value, and improve the correction efficiency and accuracy.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF EMBODIMENTS

Figure 1:
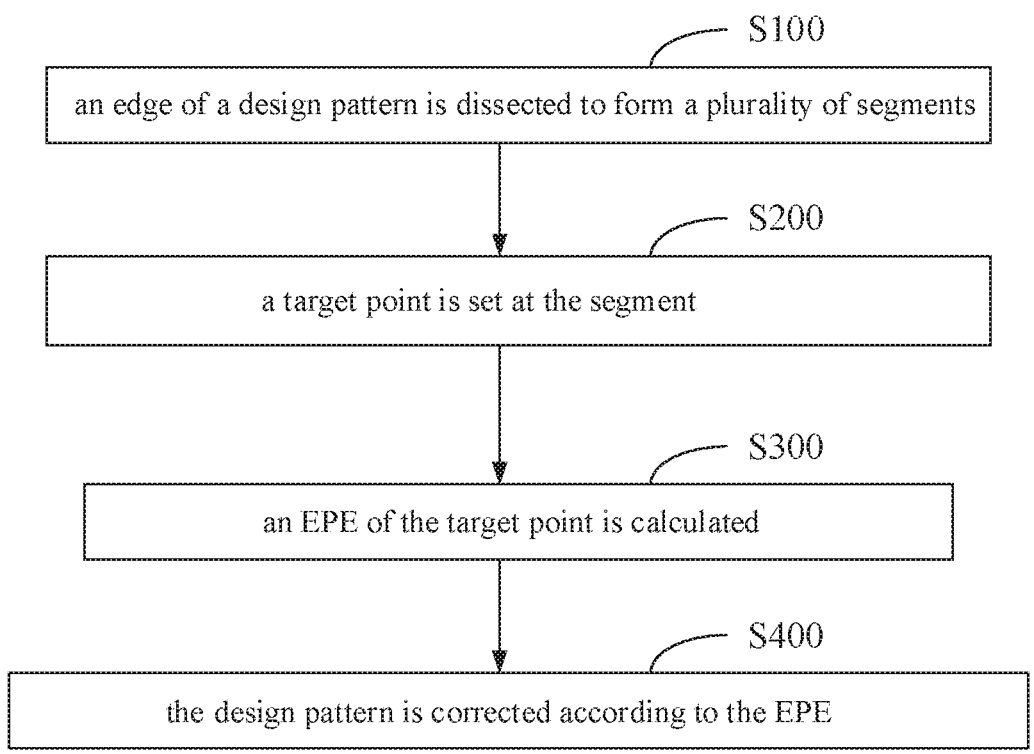
FIG. 1 is a flowchart of a method of OPC.

Embodiments of the invention are described more fully hereinafter with reference to the accompanying drawings. Preferable embodiments are presented in the drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art.

Unless otherwise defined, the technical and scientific terms used herein have the same meaning to the understanding of a person skilled in the art where the present invention pertains. The terms used in the specification of the present invention is for the purpose of describing the embodiments of the present invention, as opposed to limiting thereto. The language "and/or" used in the disclosure refers to any and all combinations of the one or multiple items listed.

Figure 2:
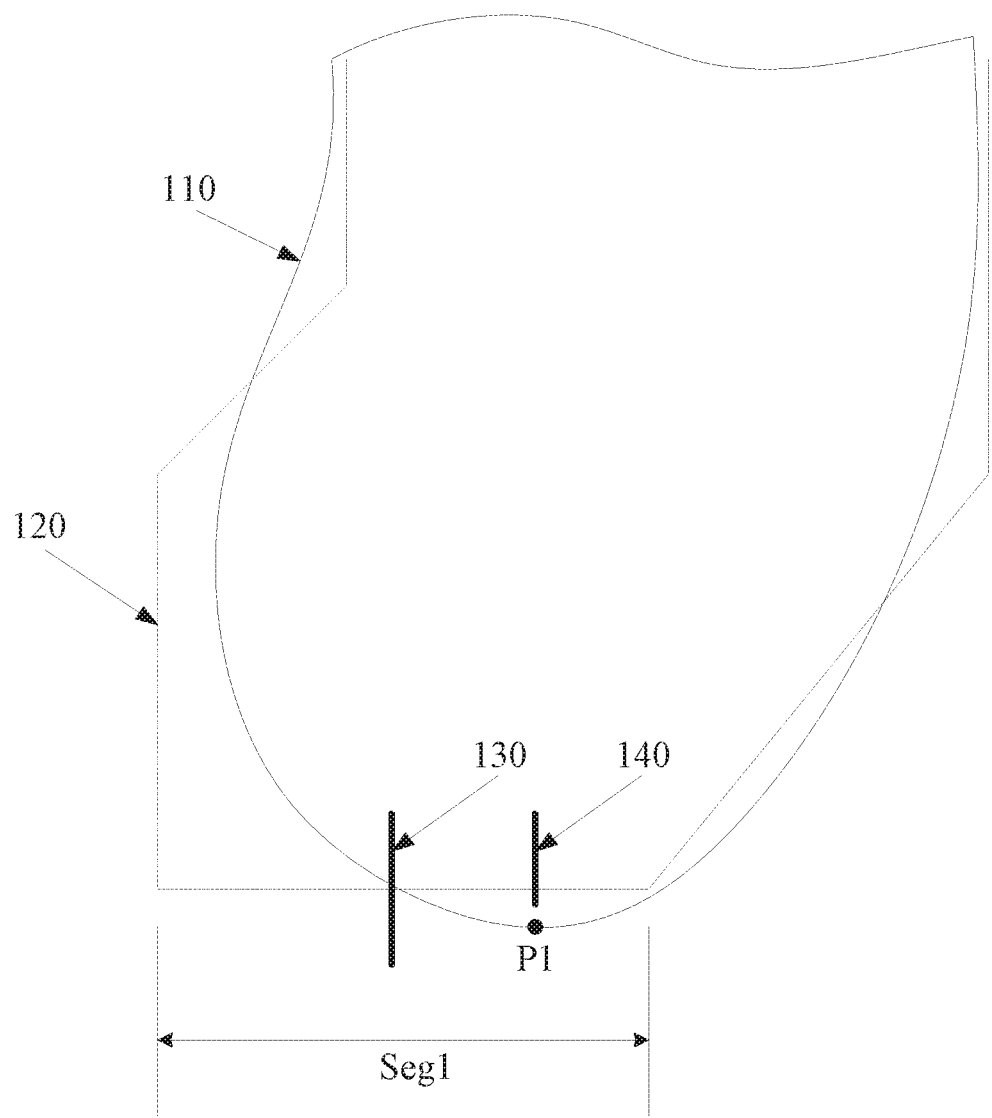
FIG. 2 is a schematic diagram of over correction.

FIG. 2 is a schematic diagram of over correction. Pattern 110 (solid line) is the simulated pattern, pattern 120 (broken line) is the design pattern, pattern 110 is a simulated pattern according to pattern 120. In a conventional method of OPC, a target point is fixedly set at a central position 130 of segment Seg1, it can be saw from the figure that, at the central position 130, the pattern 110 and pattern 120 almost coincide, thus the EPE of the central position 130 will obviously be smaller. By way of EPE correction of the pattern, a pattern that is not greatly changed can be obtained, the correction efficiency is therefore relatively low, the correction accuracy is not high.

Figure 3:
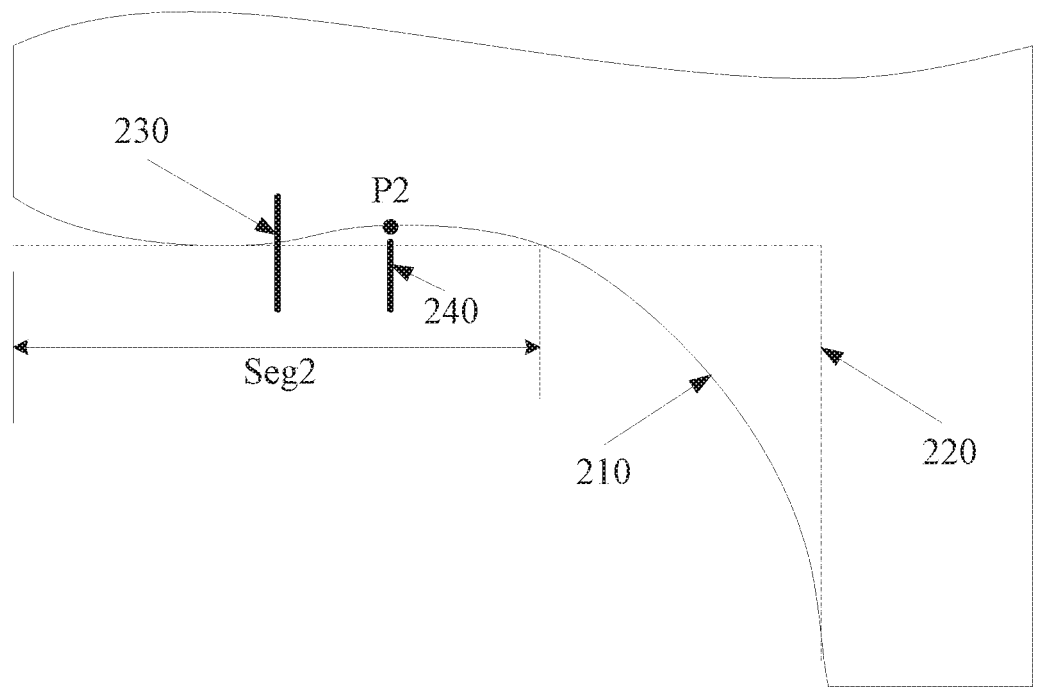
FIG. 3 is a schematic diagram of insufficient correction.

FIG. 3 is a schematic diagram of insufficient correction. Pattern 210 is the simulated pattern, pattern 220 is the design pattern, pattern 210 is a simulated pattern according to pattern 220. In a conventional method of OPC, a target point is fixedly set at a central position 230 of segment Seg2, it can be saw from the figure that, at the central position 230, the pattern 210 and pattern 220 almost coincide, thus the EPE of the central position 230 will obviously also be smaller. By way of EPE correction of the pattern, a pattern that is not greatly changed can be obtained, the correction efficiency is therefore relatively low, the correction accuracy is not high.

In a conventional method of OPC, the way of unchanged setting the target point is yet to be improved, a method of OPC where the target point is flexibly set is introduced as follows. The embodiments of the disclosure will be described in detail in combination with drawings.

FIG. 1 is a flowchart of a method of OPC.

A method of OPC includes steps of:

In step S100, an edge of a design pattern is dissected to form a plurality of segments. According to the OPC program setting, the outer edge of the design pattern is dissected, the design pattern is dissected into a plurality of segments.

In step S200, a target point is set at the segment.

The method of determining the target point is: if the segment is translated in a direction perpendicular to the segment, a tangent point of the segment and a simulated pattern coincides with the target point. Referring to FIG. 2, P1 is the tangent point, position 140 is the target point set by the present method. Referring to FIG. 3, P2 is the tangent point, position 240 is the target point set by the present method. Usually, all segments resulted from dissection will be set with corresponding target points, and then an overall pattern correction is performed. If the EPE of each of the segments meets the requirement, the correction can be ended.

The setting of the target point is relevant to the simulated pattern, which is usually located at the end point of the simulated pattern in the direction perpendicular to the segment. Therefore, the position of the target point can be determined by the foregoing method of determination. By adopting the foregoing method of determination, there may be cases where a plurality of tangent point are presented. When the segment is translated in the direction perpendicular to the segment, if more than one tangent point exist between the segment and the simulated pattern, then the tangent point corresponding to a maximal translating distance of the segment coincides with the target point. Typically, the simulated pattern will not be too far away from the designed pattern, thus if the segment is translated in the direction perpendicular to the segment, the distance of translation of the segment is within a preset range, so as to avoid misjudgment. For example, when the segment is one end of a rectangular pattern, if the segment is translated to another end of the rectangular, a misjudgment will be caused, thus the translation distance must be limited to an appropriate range.

The foregoing method of determination is just one of the methods to define the position of the target point, it does not mean that any of the steps of the foregoing methods of determination must be presented in step S200.

In step S300, an EPE of the target point is calculated. By setting the target point in step S200, as to this segment, the EPE of this target point is usually the maximal.

In step S400, the design pattern is corrected according to the EPE. As the EPE at this target point is maximal, the times of correction is decreased and the extent of insufficient correction or over correction is reduced effectively, providing the simulated result to be more matched with the target value, and improving the correction efficiency and accuracy.

After step S400 is completed, it is determined if the EPE is within a first preset range, if not, return to perform the step dissecting the edge of the design pattern to form a segment, steps S200 to S400 are repeated for several times until the EPE is within a first preset range, then the correction is ended and a final corrected pattern is acquired.

A system of OPC applying the foregoing method of OPC is described as follows.

A system of OPC applied in the semiconductor manufacture process, which includes:

a dissection module configured to dissect an edge of a design pattern to form a plurality of segments. According to the OPC program setting, the outer edge of the design pattern is dissected, the design pattern is dissected into a plurality of segments.

A setting module is configured to set a target point at the segment.

If the segment is translated in a direction perpendicular to the segment, a tangent point of the segment and a simulated pattern coincides with the target position point. Referring to FIG. 2, P1 is the tangent point, position 140 is the target point set by the foregoing method of OPC. Referring to FIG. 3, P2 is the tangent point, position 240 is the target point set by the foregoing method of OPC. Usually, all segments resulted from dissection will be set with corresponding target points, and then an overall pattern correction is performed. When the EPE of each of the segments meet the requirement, the correction can be ended.

The setting of the target point is relevant to the simulated pattern, which usually is located at the end point of the direction perpendicular to the segment of the simulated pattern. Therefore, the position of the target point can be determined by the foregoing method of determination. By adopting the foregoing method of determination, there may be cases where a plurality of tangent points are presented. If the segment is translated in the direction perpendicular to the segment, if more than one tangent point exist between the segment and the simulated pattern, then the tangent point corresponding to a maximal translating distance of the segment coincides with the target point. Typically, the simulated pattern will not be too far away from the designed pattern, thus if the segment is translated in the direction perpendicular to the segment, the distance of translation of the segment is within a preset range so as to avoid misjudgment. For example, when the segment is one end of a rectangular pattern, if the segment is translated to another end of the rectangular, a misjudgment will be caused, thus the translation distance must be limited to a certain range.

The foregoing method of determination is just one of the methods to limit the position of the target point, it does not mean that any of the steps of the foregoing methods of determination must be performed in the setting module.

A calculation module configured to calculate an EPE of the target point. By setting the target point in step S200, as to this segment, the EPE of this target point is usually the maximal.

A correction module configured to correct the design pattern according to the EPE. As the EPE at this target point is maximal, the times of correction is decreased and the extent of insufficient correction or over correction is reduced effectively, providing the simulated result to be more matched with the target value, and improving the correction efficiency and accuracy.

According to the foregoing method and system of OPC, the setting method of the target point of the segment is no longer unchanged, but varies with the pattern. Usually, one end of the curve of the simulated pattern corresponding to the segment is selected as the reference position of the target point. The end of the curve can be determined by the following method: if the segment is translated in the direction perpendicular to the segment, the tangent point of the segment with the simulated pattern is the end of the curve, then the end of the curve coincides with the target point. As for this segment, usually the EPE at the position corresponding to the end of the curve is maximal, the pattern is corrected again according to the EPE, so as to effectively decrease the times of correction, reduce the extent of insufficient correction or over correction, provide the simulated result to be more matched with the target value, and improve the correction efficiency and accuracy.

It should be understood, that although the various steps in the flow chart in FIG. 1 are successively illustrated following the arrows, these steps do not necessarily have to be carried out according to the sequence indicated by the arrows. Unless otherwise described herein, there is no strict sequence restriction of the execution of these steps which can be executed in difference sequences. Also, at least a part of the steps in FIG. 1 can include several sub-steps or several stages that do not necessarily have to be performed at a same time but can be performed at different moments; and they do not necessarily have to be performed successively but can be performed in turn or in alternate with other steps, sub-steps, stages or at least a part thereof.

It should be understood, that the illustration in FIGS. 2 and 3 are illustrative examples of a part of the pattern in the method of OPC process, and do not represent the entire structure of the pattern.

The foregoing implementations are merely specific embodiments of the present disclosure, and are not intended to limit the protection scope of the present disclosure. It should be noted that any variation or replacement readily figured out by persons skilled in the art within the technical scope disclosed in the present disclosure shall all fall into the protection scope of the present disclosure. Therefore, the protection scope of the present disclosure shall be subject to the protection scope of the claims.

What is claimed is:

1. A method of optical proximity correction (OPC), comprising:
   a. dissecting an edge of a design pattern to form a segment;
   b. setting a target point at the segment, wherein the setting comprises:
      i. translating the segment in a direction perpendicular to the segment to identify at least one tangent point formed between the segment and a simulated pattern, and
      ii. determining the target point at the segment to coincide with one tangent point identified in (i);
   c. calculating an edge placement error (EPE) of the target point; and
   d. correcting the design pattern according to the EPE.

2. The method of claim 1, wherein there are a plurality of the segments, all of the segments are provided with corresponding target points.

3. The method of claim 1, wherein more than one tangent point exists between the segment and the simulated pattern, and the at least one tangent point formed between the segment and the simulated pattern corresponding to a maximal translating distance of the segment coincides with the target point.

4. The method of claim 1, wherein after the step of correcting the design pattern according to the EPE, the method further comprises:
   determining whether the EPE is within a first preset range, returning to perform the step of dissecting the edge of the design pattern to form the segment if the EPE is not within the first preset range, and ending the correction if the EPE is within the first preset range.

5. A system of optical proximity correction (OPC), comprising:
   a. a dissection module configured to dissect an edge of a design pattern to form a plurality of segments;
   b. a setting module configured to set a target point at a segment of the plurality of segments, wherein the setting comprises:
      i. translating the segment in a direction perpendicular to the segment to identify at least one tangent point formed between the segment and a simulated pattern, and
      ii. determining the target point at the segment to coincide with one tangent point identified in (i);
   c. a calculation module configured to calculate an edge placement error (EPE) of the target point; and
   d. a correction module configured to correct the design pattern according to the EPE.

6. The system of claim 5, wherein all of the segments are provided with corresponding target points by the setting module.

7. The system of claim 5, wherein more than one tangent point exists between the segment and the simulated pattern, and the at least one tangent point formed between the segment and the simulated pattern corresponding to a maximal translating distance of the segment coincides with the target point.

8. The system of claim 5, wherein the calculation module is further configured to determine whether the EPE is within a first preset range, wherein the dissection module is further configured to perform the step of dissecting the edge of the design pattern to form the segment if the EPE is not within the first preset range, and wherein the correction module is configured to end the correction if the EPE is within the first preset range according to the calculation module.

* * * * *